(12) United States Patent
Eichrodt

(10) Patent No.: US 10,804,944 B1
(45) Date of Patent: Oct. 13, 2020

(54) NARROWBAND FILTER HAVING SHARP FILTERING CHARACTERISTIC

(71) Applicant: ALi Corporation, Hsinchu (TW)

(72) Inventor: Christian Eichrodt, Geneva (CH)

(73) Assignee: ALI CORPORATION, Hsinchu (TW)

( * ) Notice: Subject to any disclaimer, the term of this patent is extended or adjusted under 35 U.S.C. 154(b) by 0 days.

(21) Appl. No.: 16/802,192

(22) Filed: Feb. 26, 2020

Related U.S. Application Data (60) Provisional application No. 62/825,821, filed on Mar. 29, 2019.

(51) Int. Cl.
| | | |
|---|---|---|
| *H04B 1/10* | (2006.01) | |
| *H04B 1/16* | (2006.01) | |
| *H03F 3/45* | (2006.01) | |

(52) U.S. Cl.
CPC ....... *H04B 1/1027* (2013.01); *H03F 3/45475* (2013.01); *H04B 1/16* (2013.01); *H03F 2200/451* (2013.01); *H04B 2001/1063* (2013.01)

(58) Field of Classification Search
CPC ........ H04B 1/123; H04B 1/16; H04B 1/1036; H04B 1/26; H04B 1/1018; H04B 1/1027; H03L 7/087; H03F 3/45475
See application file for complete search history.

(56) References Cited

U.S. PATENT DOCUMENTS

| | | | | |
|---|---|---|---|---|
| 4,326,216 A * | 4/1982 | Jensen | .................. | H04N 9/898 386/202 |
| 4,812,919 A * | 3/1989 | Iwase | .................... | H04N 5/915 386/203 |
| 4,873,581 A * | 10/1989 | Iwase | .................... | H04N 5/915 386/307 |
| 9,431,997 B1 * | 8/2016 | Comeau | ............... | H04B 1/1009 |
| 2011/0299580 A1 * | 12/2011 | Sornin | ................. | H04B 1/1036 375/224 |
| 2013/0241598 A1 * | 9/2013 | Terashima | ............. | G01R 23/02 327/40 |
| 2013/0337760 A1 * | 12/2013 | Ko | ......................... | H04B 15/06 455/260 |

\* cited by examiner

*Primary Examiner* — Khanh C Tran
(74) *Attorney, Agent, or Firm* — J.C. Patents (57) ABSTRACT

The disclosure provides a narrowband filter coupled to a signal path of a first system. The narrowband filter includes a first frequency converter, an integrator, and a second frequency converter coupled to each other in a sequence. The first frequency converter has a first input terminal receiving an input signal from the first system. The narrowband filter also includes a current generator. The current generator has a first terminal coupled to the input signal, a second terminal coupled to a first voltage, and a control terminal coupled to an output terminal of the second frequency converter. The narrowband filter dynamically adjusts a current being drawn from the signal path of the first system, as to detect and eliminate the frequency band of the unwanted signal generated by an influence of a second system close to the first system.

20 Claims, 5 Drawing Sheets

NARROWBAND FILTER HAVING SHARP FILTERING CHARACTERISTIC

CROSS-REFERENCE TO RELATED APPLICATION

This application claims the priority benefit of U.S. provisional application Ser. No. 62/825,821, filed on Mar. 29, 2019. The entirety of the above-mentioned patent application is hereby incorporated by reference herein and made a part of this specification.

BACKGROUND

Technical Field

The invention relates a signal filter, and more particularly, relates to a narrow band notch filter for radio frequency signal.

Description of Related Art

In signal processing circuit, signals are often being received and processed simultaneously via different blocks of circuit. In the field, circuits that constituted as a block may be referred to as a (signal processing) system. Multiple systems may be designed on the same chip, microprocessor, FPGA, logic circuit etc. Systems may be implemented by logic circuits on the same chip or both analog and/or digital circuits on a printed circuit board (PCB). Each of these systems may comprises any signal processing circuits such as voltage-controlled oscillator (VCO), mixer, converter, amplifier, filter, clock, etc. for processing received signal. However, these systems may influence one or another due to the distance therebetween, traces (i.e., signal path), etc.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure is directed to a narrowband filter that has a sharp notch filtering characteristic that attenuate an unwanted signal close to the wanted signal.

In some embodiments of the disclosure, a narrowband filter is coupled to a signal path of a first signal processing system. The narrowband filter includes a first frequency converter, an integrator, a second frequency converter, and a current generator. The first frequency converter has a first input terminal receiving an input signal from the signal processing system. The integrator has an input terminal coupled to an output terminal of the first frequency converter. The second frequency converter has a first input terminal coupled to an output terminal of the integrator. In addition, the current generator has a first terminal coupled to the input signal, a second terminal coupled to a first voltage, and a control terminal coupled to an output terminal of the second frequency converter.

In some embodiments of the disclosure, a radio frequency (RF) receiver circuit coupled to an antenna for receiving a RF frequency signal includes a first signal processing system, a second signal processing system, and a narrowband filter. The first signal processing system has a first local oscillator generating a first local oscillating frequency for processing the received RF signal. The second signal processing system has a second local oscillator generating a second local oscillating frequency for processing the received RF signal. In addition, the narrowband filter is coupled to a signal path of the first signal processing system, and configured to attenuate an unwanted signal received at an input of the first signal processing system based on the first and second local oscillating frequencies, wherein the unwanted signal is caused by the second local oscillator of the second signal processing system.

To make the above features and advantages of the disclosure more comprehensible, several embodiments accompanied with drawings are described in detail as follows.

It should be understood, however, that this summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
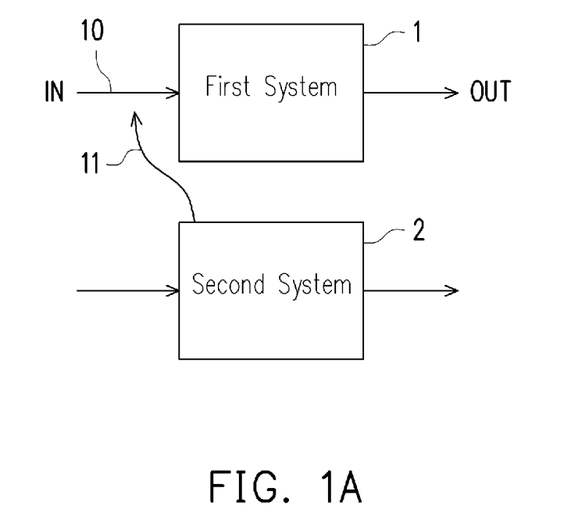
FIG. 1A is a diagram illustrating an input signal of a first system, which includes an unwanted signal produced by signal process of a second system that pollutes the input signal of a first system according to one of the embodiments.
Figure 1B:
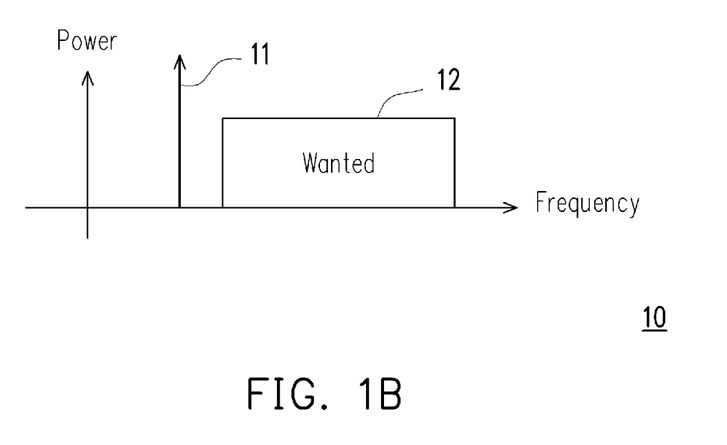
FIG. 1B shows a diagram illustrating the input signal of the first signal according to one of the embodiments.

Signal processing systems may influence one and another due to the distance therebetween, traces (i.e., signal path), etc. FIG. 1A is a diagram illustrating an input signal 10 of a first system 1, which includes an unwanted signal 11 produced by signal process of a second system 2 that pollutes the input signal of a first system 1 according to one of the embodiments. FIG. 1B shows a diagram illustrating the input signal 10 of the first signal according to one of the embodiments. The input signal 10 includes the unwanted signal 11 and a wanted signal 12. In other words, the first system 1 is polluted by the second system 2 located on the same chip or circuit board or another circuit board that is close to the first system 1. With reference to FIG. 1B, the pollution (also referred to as unwanted signal 11) has a narrow band and adjacent to the wanted signal 12. The pollution has sufficient power to interfere with the first system 1 (e.g., at the input of the system 1 or the signal process of system 1) due to limited dynamic range (a blocker).

The disclosure provides a narrowband filter for reducing or eliminating the interference of the unwanted signal produced by the second system 2 to first system 1 by using a narrowband filter around the unwanted signal without affecting the wanted signal. The narrowband filter utilizes the local oscillation frequencies of the first and second systems 1, 2 to obtain a particular frequency band that has the unwanted signal. In the disclosure, the narrowband filter of the disclosure dynamically adjusts a current being drawn from a signal path of a signal processing system, as to eliminate the frequency band of the unwanted signal. The narrowband filter is coupled to the signal path of the first or second system that filter out the unwanted signal by creating a sharp notch filter at the obtained frequency band. In some embodiments, the narrowband filter changes the resistance of the signal path by adjusting the current or the voltage based on the obtained frequency band. The detail of the disclosure would be explained in detail with embodiments below.

Figure 2:
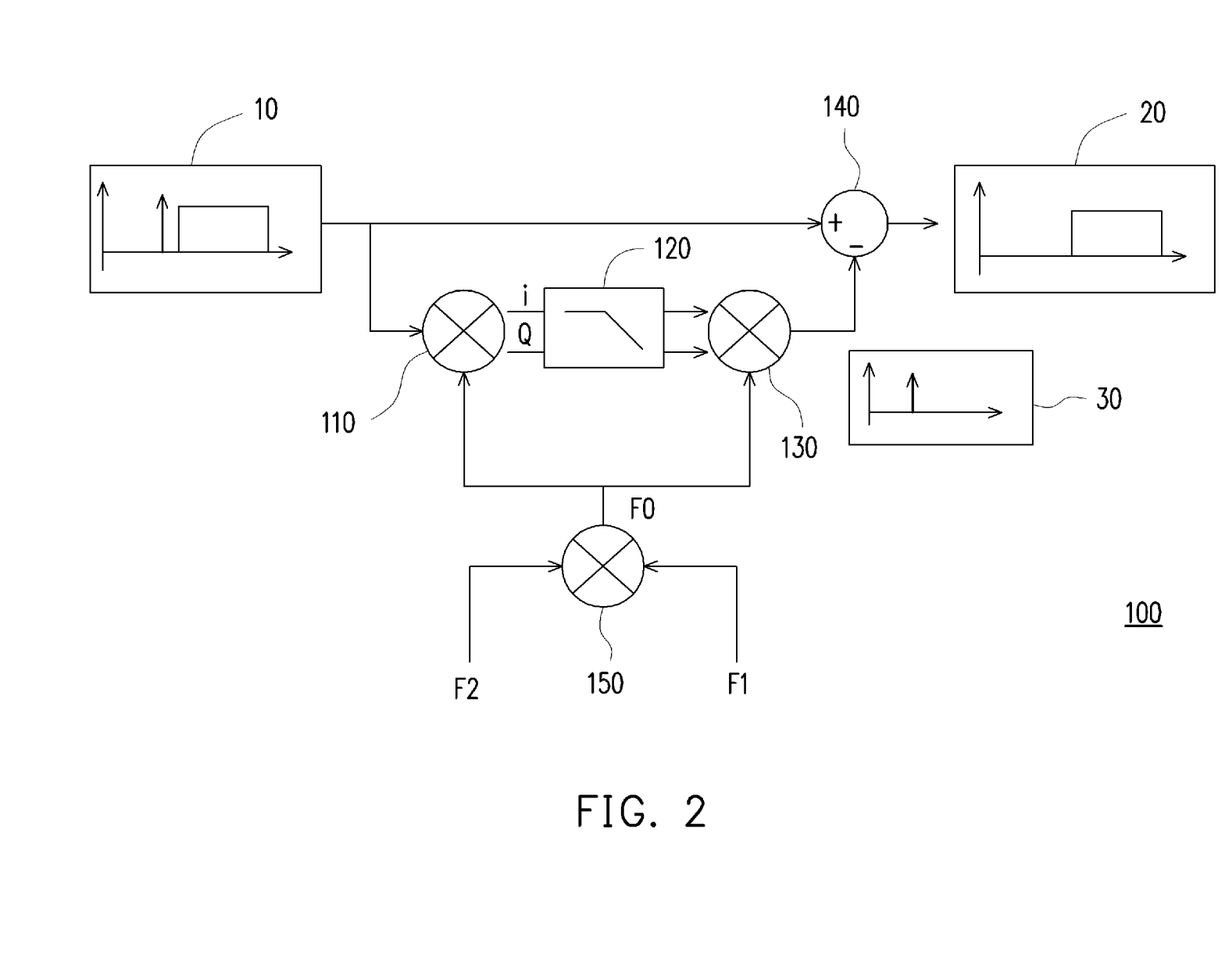
FIG. 2 is a diagram illustrating a narrowband filter according to one of the embodiments.

FIG. 2 is a diagram illustrating a narrowband filter 100 according to one of the embodiments. In the embodiment, the narrowband filter 100 is disposed on a signal path of a system (e.g., the first system 1 illustrated in FIG. 1A). The narrowband filter 100, which may also be referred as a sharp notch filter, includes a first frequency converter 110, an low pass filter 120, a second frequency converter 130, a combiner 140, and a mixer 150. The first frequency converter 110 includes an output terminal and an input terminal coupled to the input signal 10. The low pass filter 120 includes an output terminal and an input terminal coupled to the output terminal of the first frequency converter 110. The second frequency converter 130 includes an output terminal and an input terminal coupled to the output terminal of the low pass filter 120. The combiner 140 includes a first input terminal coupled to the input signal 10, a second input terminal coupled to the output terminal of the second frequency converter 130, and an output terminal. In the embodiment, the combiner 140 is configured to subtract a signal received from the second input terminal from the input signal 10 received from the first input terminal and output an output signal 20 where the unwanted signal 11 of the input signal 10 is eliminated or attenuated. The mixer 150 is configured to receive a first local oscillating frequency F1 from the first system 1 and a second local oscillating frequency F2 from the second system 2, and then output the reference frequency F0.

In detail, the input signal 10 is coupled to two different signal paths of the narrowband filter 100. In a first signal path, the input signal 10 is coupled to an input terminal of the combiner 140. In a second signal path, the input signal 10 is coupled to the first frequency converter 110. The first frequency converter 110 down-converts the received input signal 10 by using the reference frequency F0. The output of the first frequency converter 110 is coupled to an input of the low pass filter 120 for a low pass filtering operation. The output of the low pass filter 120 is then up-converted by the second frequency converter 130 by using the reference frequency F0 to produce a first signal 30, which is equivalent to the unwanted signal 11. The first signal 30 is then coupled to the combiner 140, where the first signal 30 is subtracted from the input signal 10. As a result, the narrowband filter 100 generates an output signal 20 where the unwanted signal 11 of the input signal 10 is eliminated or attenuated. The narrowband filter 100 down converting the input signal 10 from an input end at a frequency F0, low pass filtering at a frequency, up-converting at the frequency F0, and then subtracting from the input signal 10.

In the embodiment, the subtraction of the unwanted signal 11 may be implemented with a voltage-controlled component. For example, a difference amplifier may be used as the combiner 140 illustrated in FIG. 2. Based on the reference frequency F0, the combiner 140 may subtract the unwanted signal 11 from the input signal 10.

In the embodiment, the reference frequency F0 is determined by using a first local oscillating frequency F1 of a local oscillator in the first system 1 and a second local oscillating frequency F2 of a local oscillator in the second system 2. In various embodiments, the local oscillators of the first and second systems 1, 2 have different oscillating frequencies. The reference frequency F0 would be a difference between the oscillating frequencies of the first and second systems 1, 2. For example, the oscillating frequency of the first system may be 9.75 GHz, and the oscillating frequency for the second system 2 may be 10.6 GHz. The difference would be 850 MHz, which may be used as the reference frequency of the narrowband filter 100 for generating a sharp stop band around the frequency of 850 MHz. The specific frequency values are used for example only. The narrowband filter of the disclosure may be utilized in other systems using different oscillating frequencies for processing received signal.

Figure 3:
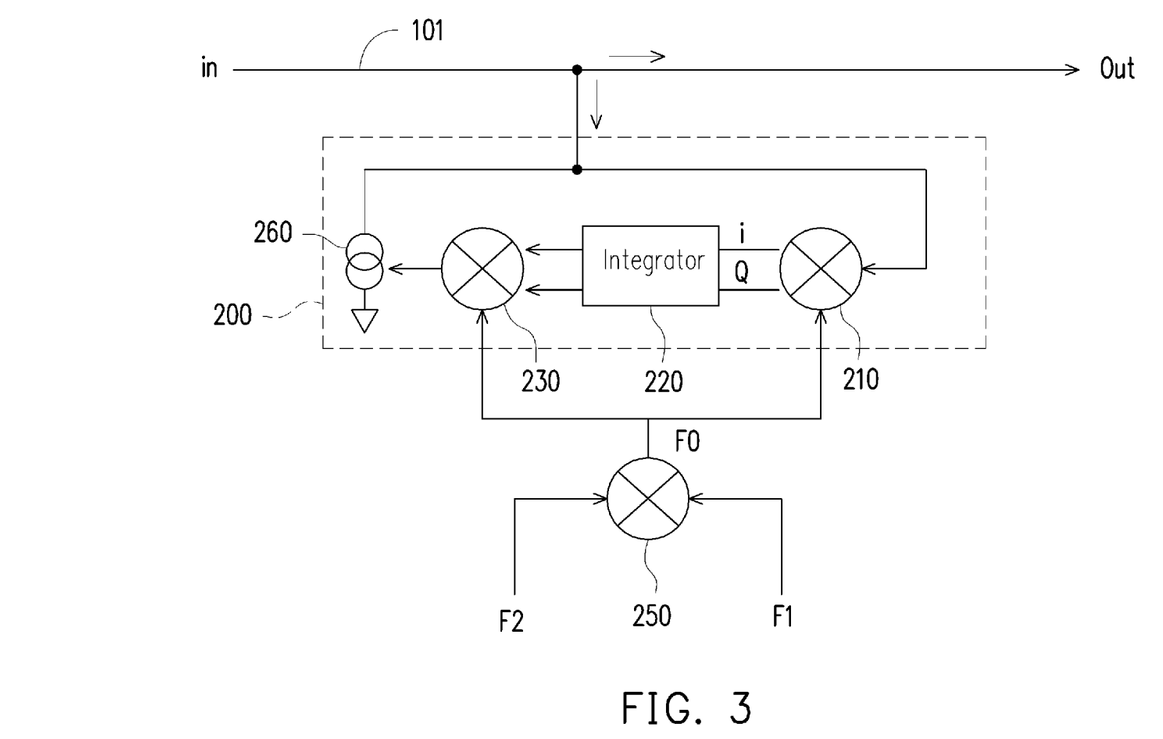
FIG. 3 is a diagram illustrating a narrowband filter according to one of the embodiments.

FIG. 3 is a diagram illustrating a narrowband filter 200 according to one of the embodiments. In the embodiment, the narrowband filter 200 may be implemented by using an impedance resonator. The narrowband filter 200 may be coupled to a signal path 101 of the first system 1. In the embodiment, the narrowband filter includes a first frequency converter 210, an integrator 220, a second frequency converter 230, a mixer 250 and a current generator 260. The signal path 101 is coupled to a common node between the first frequency converter 210 and the current generator 260, where an input signal is coupled to an input terminal of the first frequency converter 210 and a first terminal of the current generator 260. An output terminal of the first frequency converter 210 is electrically coupled to an input terminal of the integrator 220. An output terminal of the integrator 220 is electrically coupled to the second frequency converter 230. An output terminal of the second frequency converter 230 is electrically coupled to a control terminal of the current generator 260. A second terminal of the current generator 260 is coupled to a ground. The mixer 250 includes input terminals that are respectively coupled to the local oscillators of the first and second systems 1, 2 for generating the reference frequency F0 at an output terminal of the mixer 250.

In the embodiment, the first frequency converter 210 down-converts the input signal 10 according to a reference frequency F0. The down-converted input signal is then transmitted to the integrator 220 for signal integration and low pass filtering on the down-converted input signal at the reference frequency F0. In the embodiment, the integrator 220 may include gain amplifiers, capacitor and low pass filer. In one of the embodiments, the integrator 220 further includes a comparator receiving respectively receiving of the output signal (which is a differential pair signal) of the low pass filter, a finite state machine (FSM) receiving a comparison result of the differential pair signal, and a digital-to-analog converter coupled to an output of the FSM, as to minimize the DC offset of the signal being processed by the integrator. The disclosure is not intended to limit the implementation of the filters in the integrator 220. In one of the embodiments, the low pass filter of the integrator 220 may include switched-capacitor filter, transconductance with capacitor filter, op-amp MOSFET-C filters, op-amp MOSFET-RC filter, Gm-C filters, etc. In the embodiment, the gain amplifier of the integrator may include a transconductance amplifier (GM amplifier) that outputs a current based on the input voltages, which is coupled to the current generator 260. After the processing of the integrator 220, the filtered input signal is transmitted to the second frequency converter 230 for up-conversion according to the reference frequency F0. In the embodiment, the second frequency converter 230 may be implemented by a classical Gilbert mixer, where the output current from the integrator 220 may be configurable depending on design requirements. The reference frequency F0 is generated according to the local oscillators of the first and second systems 1, 2. Filtering characteristic of narrowband filter 200 maybe dynamically adjustable based on the frequencies of the input signal 10 and the local oscillator frequencies F1, F2 of the first and second systems 1, 2.

Figure 4:
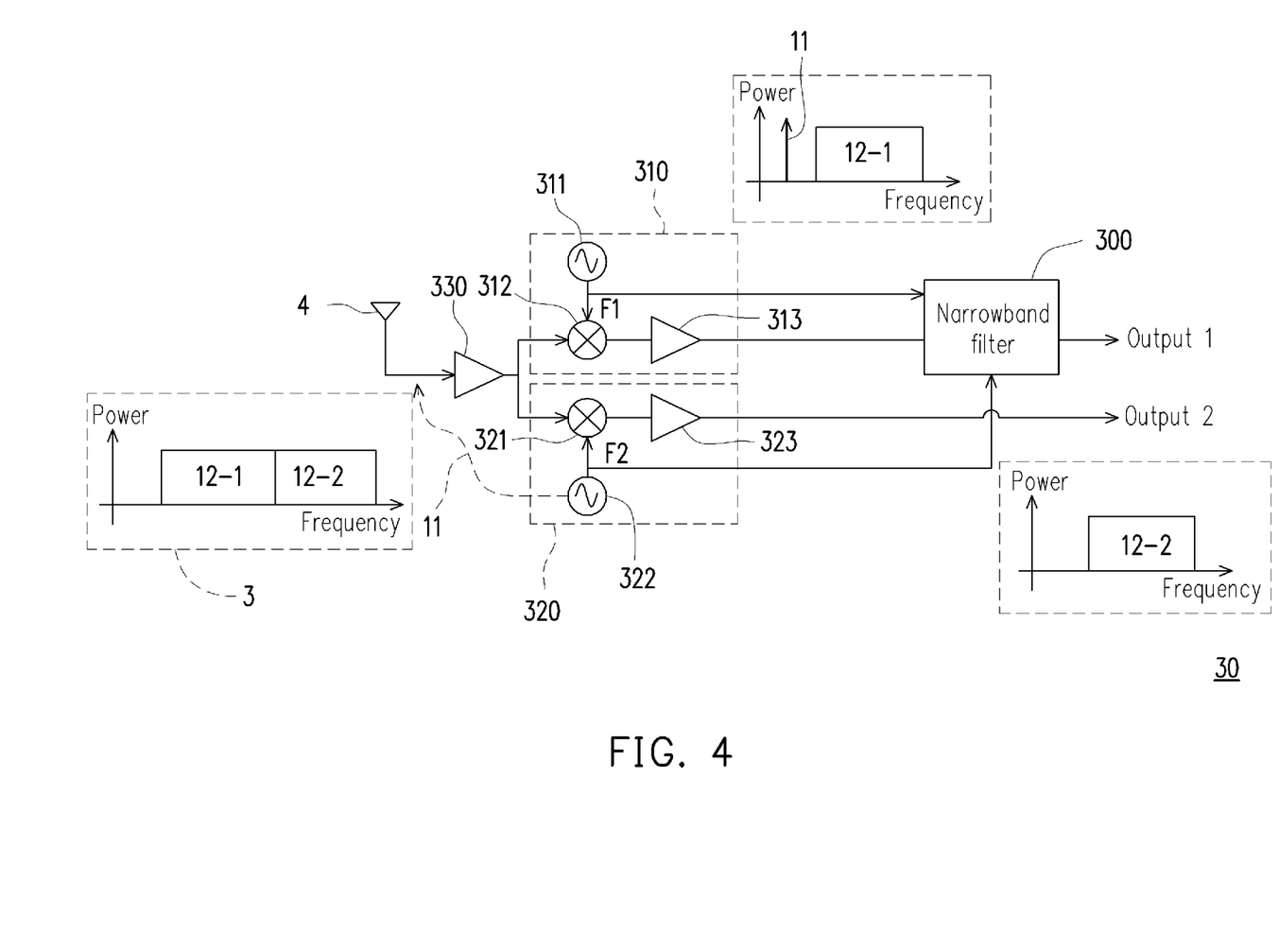
FIG. 4 is a diagram illustrating a low noise block (LNB) converter having a narrowband filter according to one of the embodiments of the disclosure.

FIG. 4 is a diagram illustrating a low noise block (LNB) converter 30 having a narrowband filter 300 according to one of the embodiments of the disclosure. The LNB converter 30 is coupled to an antenna 4 and utilized to perform low-noise amplification and frequency conversion. In the embodiment, a radio frequency (RF) signal transmitted from the satellite (e.g., 10.7 GHz-12.75 GHz) may be received through the antenna 4, and then the received RF signal may be amplified and converted to an intermediate frequency (IF) signal (e.g., 1 GHz) by the LNB converter 30. The IF signal is then supplied to a set-top-box (STB), also referred to as a tuner and eventually reaches to a television or any monitor (image displaying electronic device) for displaying the information embedded in the RF signal.

With reference to FIG. 4, the LNB converter is a dual port LNB converter (e.g., a twin LNB downconverter connected to one or more antenna), where a received RF signal 3 carries two wanted signals 12-1, 12-2. The LNB converter 30 includes a first system 310, a second system 320, a low noise amplifier (LNA) 330, and a narrowband filter 300. The received RF signal 3 is received and inputted to the first and second systems 310, 320 through the LNA 330. The first system 310 down-converts the received RF signal 3 by down-converts the received RF signal to a first IF signal with a first local oscillating frequency F1 through a mixer 312, where the first local oscillating frequency F1 is generated by a local oscillator 311. The output of the mixer 312 coupled to an IF amplifier 313. Similarly, the received RF signal 3 is input to the second system 320. The second system 320 down-converts the received RF signal 3 to a second IF signal through a mixer 321 by using a second local oscillating frequency F2. The second local oscillating frequency F2 is generated by a local oscillator 322 of the second system 320. Then, the output is coupled to an IF amplifier 323 for generating an output of the second system 320.

In the embodiment, the second local oscillating frequency F2 generated by the local oscillator 322 of the second system 320 is greater than the first local oscillating frequency F1 generated by the local oscillator 312 of the first system 310. As illustrated in FIG. 4, the second local oscillating frequency influences the input of the first system 310, and therefore, the first system 310 produces an output signal having the wanted signal 12-1 and an unwanted signal 11. In the embodiment, the influence at an input of the second system 320 by the local oscillator 312 of the first system 310 would be omitted in this embodiment for the purpose of comprehensive. However, the disclosure is not limited thereto. The second system 320 may also be coupled to a narrowband filter as well in other embodiments of the disclosure. In the embodiment, the output of the first system 310 is coupled to the narrowband filter 300 which may be implemented by the narrowband filter 100 illustrated in FIG. 2 or the narrowband filter 200 illustrated in FIG. 3. Furthermore, the local oscillators 312, 322 of the first and second systems 310, 320 are coupled to the narrowband filter 300 for generating the reference frequency F0.

In the above descriptions, input signal of the narrowband filter is being described as one signal path. However, the disclosure is not limited thereto. In other embodiments where the input signal being processed are RF signal or IF signal or any other stages of the RF signal processing circuitry, the RF signal would be modulated into quadrature signals (i.e., signals I and Q). The narrowband filter may be placed or coupled to each signal path of the quadrature signal. In one of the embodiments, the narrowband filter may be placed in a signal path of I phrase, and another narrowband filter may be placed in a signal path of Q phrase. Furthermore, it should be noted that each of the signals I and Q are differential pair signal. The disclosure illustrates these signals with single lines only for the sake of brevity, those skilled in art would understand that each of the signal lines represents differential pair signals.

Figure 5:
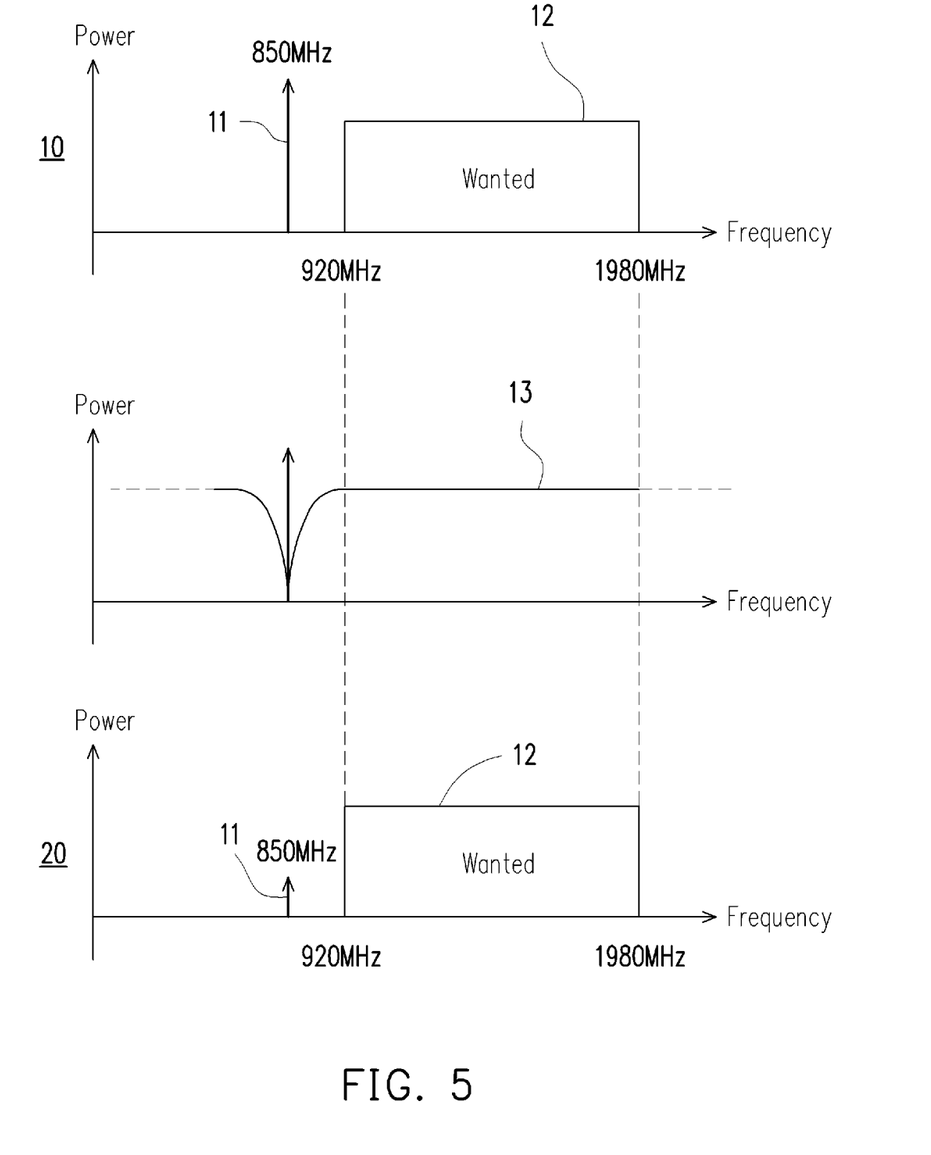
FIG. 5 is a diagram illustrating the filtering characteristic of a narrowband filter according to one of the embodiments of the disclosure.

FIG. 5 is a diagram illustrating the filtering characteristic of the narrow band filter 300 according to an embodiment of the disclosure. In the embodiment, a first system 1 has a first local oscillating frequency of 9.75 GHz, and a second system 2 has a second local oscillating frequency of 10.6 GHz, for example. In the embodiment, the local oscillating frequencies are utilized for down-converting a radio frequency (RF) signal received by an antenna 4 to an intermediate frequency (IF) signal, however, the disclosure is not limited thereto. The local oscillating frequencies may be any reference local frequencies utilized for signal processing.

In the disclosure, the narrowband filter illustrated in FIGS. 2-4 may be disposed on a signal path of a first system 1, for example, an LNB converter, where a signal received from antenna may be feed into the first system 1 for processing. The narrowband filter may be disposed at any location alone the signal path of the receiver. For example, the narrowband filter may be disposed at any locations between an amplifier, band pass filter, line driver, etc. of the receiver. The disclosure is not intended to limit the location of the narrowband filter within the system. In the embodiment, an input signal 10 is feed into the narrowband filter, where the input signal includes an unwanted signal 11 and a wanted signal 12. The unwanted system Curve 13 shows a sharp notch filtering characteristic of the narrowband filter. In the embodiment, the stopband of the narrowband filter would be 850 MHz due to the oscillating frequencies of the local oscillators of the first and second systems 1, 2. After filtering of the narrowband filter, an output signal 20 shows that the unwanted signal 11 is attenuated and allowing only the wanted signal 20 to pass for further processing of the receiver.

In the above, a twin LNB downconverter receiving RF signal from one or more antenna is illustrated as an example for implementing the narrowband filer described above. One (first) path or channel of twin LNB downconverter of a first output may be the first system 1 and anther (second) path or channel of a second output may be the second system 2, where the signal processing of the first and second paths interfere with each other. In the embodiments, the narrowband filter may be disposed on the first path using lower mixing frequency as compared to the second path. In other embodiments, the narrowband filter may be disposed in both the first and second paths of the LNB downconverter. Furthermore, the disclosure is not intended to limit the number of the signal path in an LNB downconverter. For example, the narrowband filter illustrated above may be used or integrated with a single LNB downconverter, a twin LNB downconverter, or multi LNB downconverter.

Although the narrowband filter is illustrated by using LNB downconverters, it is not intended to limit the disclosure. In other embodiments, the narrowband filter may be implemented in any system that includes a plurality of signal processing systems that may interfere with each other.

In other embodiments, the first and second systems may be systems in an antenna duplexer, where the first system may be a receiver end while the second system is a transmitter. During the receiving operation, an input terminal of the receiver may be affected by a local oscillator of the transmitter. Therefore, the narrowband filter of the disclosure may also be coupled to a signal pass of the receiver (i.e., first system 1), as to attenuate or eliminate an unwanted signal caused by the transmitter (i.e., second system 2) of the duplexer.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

Exemplary embodiments of the present invention, described herein, include various operations. These operations may be performed by hardware polarizations, software, firmware, or a combination thereof. As used herein, the term "coupled to" may mean coupled directly or indirectly through one or more intervening polarizations. Any of the signals provided over various buses described herein may be time multiplexed with other signals and provided over one or more common buses. Additionally, the interconnection between circuit polarizations or blocks may be shown as buses or as single signal lines. Each of the buses may alternatively be one or more single signal lines and each of the single signal lines may alternatively be buses.

Exemplary embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A single carrier cancellation (SCC) circuit, coupled to a signal path of a first signal processing system, comprising:
   a first frequency converter, having a first input terminal receiving an input signal from the first signal processing system, and configured to frequency convert the input signal based on a first local oscillating frequency of the first signal processing system and a second local oscillating frequency of a second signal processing system;
   a low pass filter, having an input terminal coupled to an output terminal of the first frequency converter;
   a second frequency converter, having a first input terminal coupled to an output terminal of the low pass filter; and
   a combiner, having a first terminal receiving the input signal and a second terminal coupled to an output terminal of the second frequency converter, and configured to subtract a signal received from the second terminal from the input signal.

2. The SCC circuit of claim 1, wherein the combiner comprises:
   a current generator, having a first terminal coupled to the input signal, a second terminal coupled to a first voltage, and a control terminal coupled to the output terminal of the second frequency converter.

3. The SCC circuit of claim 2, wherein the first terminal of the current generator is coupled to the first input terminal of the first frequency converter, and the input signal of the first signal processing system is coupled to a common node between the current generator and the first frequency converter.

4. The SCC circuit of claim 1, wherein the combiner comprises:
   a difference amplifier, having a first input terminal coupled to the input signal and a second input terminal coupled to the output terminal of the second frequency converter.

5. The SCC circuit of claim 1, further comprising:
   a mixer receiving the first local oscillating frequency from the first signal processing system and the second local oscillating frequency from the second signal processing system, and configured to generate a reference frequency based on the first and second local oscillating frequencies,
   wherein the first frequency converter further comprises a second input terminal receiving the reference frequency, and the second frequency converter further comprises a second input terminal receiving the reference frequency.

6. The SCC circuit of claim 5, wherein the first frequency converter is configured to down-convert the input signal based on the reference frequency.

7. The SCC circuit of claim 5, wherein the second frequency converter is configured to up-convert the input signal based on the reference frequency.

8. The SCC circuit of claim 1, wherein the input signal includes a wanted signal and an unwanted signal produced by the second signal processing system at an input terminal of the first signal processing system.

9. A narrowband filter, coupled to a signal path of a first signal processing system, comprising:
   a first frequency converter, receiving an input signal from the first signal processing system, configured to perform a frequency down-conversion based on a first local oscillator frequency received from the first signal processing system and a second local oscillator frequency received from a second signal processing system;

an integrator, coupled to an output terminal of the first frequency converter; and a second frequency converter, coupled to an output terminal of the integrator, and configured to perform a frequency up-conversion based on the first local oscillator frequency and the second local oscillator frequency, and generating an output signal for attenuating an influence of the second signal processing system at an input terminal of the first signal processing system.

10. The narrowband filter of claim 9, further comprising:
a combiner, having a first terminal receiving the input signal and a second terminal coupled to an output terminal of the second frequency converter, and configured to subtract the output signal generated by the second frequency converter from the input signal.

11. The narrowband filter of claim 9, further comprising:
a current generator, having a first terminal coupled to the input signal, a second terminal coupled to a first voltage, and a control terminal coupled to an output terminal of the second frequency converter.

12. The narrowband filter of claim 11, wherein the first terminal of the current generator is coupled to the input terminal of the first frequency converter, and the input signal of the first signal processing system is coupled to a common node between the current generator and the first frequency converter.

13. The narrowband filter of claim 11, further comprising a mixer receiving the first local oscillator frequency from the first signal processing system and the second local oscillator frequency from the second signal processing system, and configured to generate a reference frequency based on the first and second local oscillating frequencies and output the reference frequency to the first and second frequency converter.

14. A radio frequency (RF) receiver circuit, coupled to an antenna for receiving a RF frequency signal, comprising:
a first signal processing system, having a first local oscillator generating a first local oscillating frequency for processing the received RF signal;
a second signal processing system, having a second local oscillator generating a second local oscillating frequency for processing the received RF signal; and
a narrowband filter, coupled to a signal path of the first signal processing system, and configured to attenuate an unwanted signal received at an input of the first signal processing system based on the first and second local oscillating frequencies,
wherein the unwanted signal is caused by the second local oscillator of the second signal processing system.

15. The RF receiver circuit of claim 14, wherein the narrowband filter is configured to attenuates the unwanted signal according to a difference between the first and second local oscillating frequencies.

16. The RF receiver circuit of claim 14, further comprising:
a mixer receiving the first local oscillating frequency from the first signal processing system and the second local oscillating frequency from the second signal processing system, and configured to generate a reference frequency based on the first and second local oscillating frequencies,
wherein the narrowband filter attenuates the unwanted signal based on the reference frequency.

17. The RF receiver circuit of claim 14, wherein the narrowband filter comprises:
a mixer, receiving the first and second local oscillating frequencies and generating a reference frequency;
a first frequency converter, receiving an input signal from the first signal processing system and the reference frequency; and
a low pass filter, coupled to an output terminal of the first frequency converter;
a second frequency converter, coupled to an output terminal of the low pass filter, and receiving the reference frequency, and generating an output signal for attenuating the unwanted signal.

18. The RF receiver circuit of claim 17, wherein the first frequency converter is configured to down-convert the input signal based on the reference frequency.

19. The RF receiver circuit of claim 17, wherein the second frequency converter is configured to up-convert the output of the low pass filter based on the reference frequency.

20. The RF receiver circuit of claim 14, wherein the first and second local oscillating frequencies are utilized for converting the received RF signal to intermediate frequency (IF) signal, wherein the second local oscillating frequency is higher than the first local oscillating frequency.

\* \* \* \* \*